United States Patent [19]

McBride

[11] Patent Number: 5,109,601
[45] Date of Patent: May 5, 1992

[54] METHOD OF MARKING A THIN FILM PACKAGE

[75] Inventor: Donald G. McBride, Binghamton, N.Y.

[73] Assignee: International Business Machines Corporation, Armonk, N.Y.

[21] Appl. No.: 480,344

[22] Filed: Feb. 12, 1990

Related U.S. Application Data

[60] Division of Ser. No. 408,959, Sep. 18, 1989, Pat. No. 4,965,700, which is a continuation of Ser. No. 199,228, May 26, 1988, abandoned.

[51] Int. Cl.⁵ .............................................. H05K 3/34
[52] U.S. Cl. ............................................ 29/840; 29/830; 29/846
[58] Field of Search ................... 29/825, 830, 840, 846

[56] References Cited

U.S. PATENT DOCUMENTS

| | | | |
|---|---|---|---|
| 3,868,724 | 3/1975 | Perrino | 357/65 |
| 4,074,342 | 2/1978 | Honn et al. | 29/830 X |
| 4,141,782 | 5/1979 | Dugan et al. | 156/643 |
| 4,264,917 | 7/1981 | Ugon | 357/74 |
| 4,517,051 | 12/1985 | Gazdik et al. | 156/644 |
| 4,788,767 | 12/1988 | Desai et al. | 29/830 |
| 4,984,358 | 1/1991 | Nelson | 29/830 |

OTHER PUBLICATIONS

IBM Technical Disclosure Bulletin vol. 22 No. 9 Feb. 1980 p. 3988 by J. Funari et al.
IBM Technical Disclosure Bulletin vol. 23 No. 9 Feb. 1981, p. 4062 by S. M. Jensen et al.

Primary Examiner—Carl J. Arbes
Attorney, Agent, or Firm—Douglas M. Clarkson

[57] ABSTRACT

The disclosure describes a method of manufacturing a structure of a thin, flexible package assembly that permits electrical devices to be bonded to an electrical circuit utilizing mixed bonding techniques.

A sacrificial metal carrier material is used to support a thin polyimide or TEFLON substrate, through which openings, called "vias", are formed at locations where bonding pad areas are needed to affix electrical devices. An electrical circuit is formed on the thin flexible substrate, including making the vias conductive, utilizing known processes, and then, the sacrificial metal carrier material is removed, as for example by etching it away, except in locations where metal bumps will be needed to bone a device by thermo compression bonding.

7 Claims, 1 Drawing Sheet

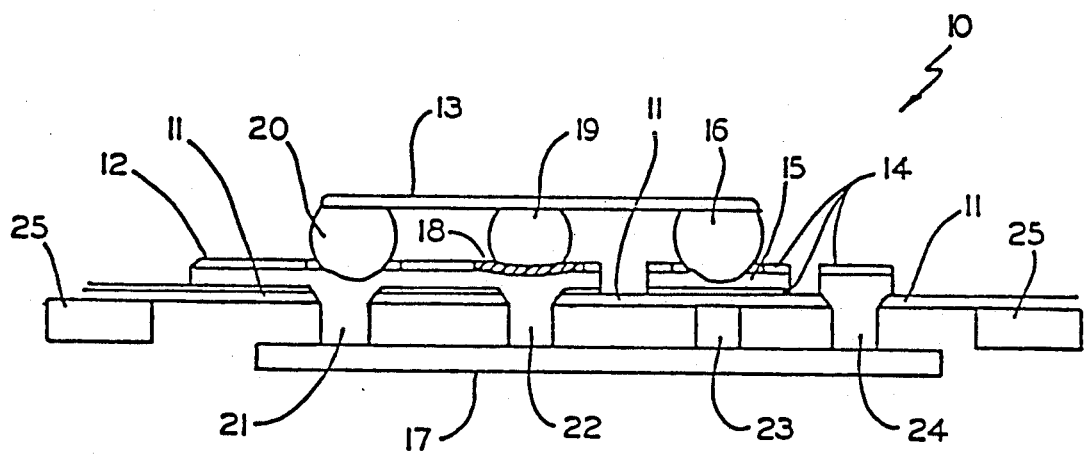

METHOD OF MARKING A THIN FILM PACKAGE

This application is a division of Ser. No. 07/408,959, filed Sep. 18, 1989, now U.S. Pat. No. 4,965,700, which is a continuation of Ser. No. 07/199,228, filed May 26, 1988, now abandoned.

BACKGROUND OF THE INVENTION

1. Field of the invention

The present invention, generally, relates to the packaging of electronic devices and, more particularly, to a structural arrangement that admits the use of mixed bonding techniques for affixing electronic devices.

The electronics industry today is growing with ever increasing speed, and the manufacturing technology used in the packaging of its components is advancing now with matching speed. As an example, a single monolithic chip measuring less than one-half of an inch square can store today at least one million bits of information and data, because such a chip can support many electronic circuits. Placing more and more electronic circuits on smaller and smaller chips makes the task of packaging such chips with their modules, increasingly more difficult.

A principal difficulty in attaching a device to a module is due to a mismatch in their respective coefficients of thermal expansion. This mismatch causes fractures, actual breaking and other circuit discontinuities in electrical connections, such as solder joints, during thermal cycling. For example, the coefficient of thermal expansion for a typical chip is in the order of 3 micro inches per inch per degree Centigrade, while the coefficient of thermal expansion for a typical ceramic module is in the order of 7 micro inches per inch per degree Centigrade.

These fractures, breakages and other discontinuities in electrical connections are caused by stresses that develop when there is temperature cycling in the environment. This problem is compounded still further when a device, such as a chip, is affixed rigidly to a module, as they are so often. The prior art reveals many efforts to solve problems that develop due to thermal mismatches.

In the current trend today toward ever smaller packaging of these miniturized and, now, these subminiturized circuits, problems concerning the mismatches in coefficients of thermal expansion are not the only difficulties that have developed. It is often highly desirable to be able to affix a device to a circuit carrier by different bonding techniques, and the making of the carrier very thin and flexible to solve the mismatch problem, has caused the problem of using different bonding techniques to be more acute.

A bonding technology known in the packaging industry as Tape Automated Bonding (or "TAB") is developing rapidly and is a much used technique. It is similar to a technique that is used even more widely by some manufacturers known as Controlled Collapse Chip Connection (called "C-4"), except the organic tape (usually polyimide) is generally thick, and the bonding technique is the thermo compression type.

Thermo compression bonding generally requires a bump on the chip and/or on the flexible circuitry. Pads on the chip typically are aluminum, and therefore, it is desirable to have the bumps on the tape formed of aluminum also. It would be a significant advantage to have a common flexible thin film carrier with bumps such that both bonding techniques can be used to affix a device, such as a chip to the carrier.

2. Description of the prior art

U.S. Pat. No. 4,159,222 to Lebow et al. teaches a method of manufacturing a circuit having a particular circuit line density which, at that time, was a real achievement. The manufacturing process, as taught by this prior patent, is not concerned with thermal mismatches or with providing a thin film carrier structure that will accept mixed bonding technologies to affix devices to the circuit.

U.S. Pat. No. 4,372,804 to Hanabusa et al. discloses a method of forming thicker copper areas on a copper foil using aluminum foil as a temporary carrier. Apparently, it was believed at that time that thick copper areas make stronger land areas in a completed rigid multi-layer printed circuit board.

U.S. Pat. No. 4,495,546 to Nakamura et al. is concerned with providing a flexible circuit board that can be folded and inserted into an opening in another board. The method of producing such a flexible circuit board is completely different from the present invention, as will be understood as the description proceeds.

U.S. Pat. No. 4,567,543 to Miniet shows a double sided flexible circuit with plated-through holes, one side of which is adapted for affixing devices with leads while the opposite side is adapted for affixing devices without leads. Both the method of making a thin flexible circuit board and the circuit board structure itself, in accordance with the invention, are patentably distinct from that of this Miniet patent, as will appear from the detailed description to follow.

As has been mentioned previously hereinabove, the present-day trend is toward ever thinner, more flexible circuit boards with finer and finer electrically conductive lines to obtain denser and denser circuits within the same space. While the above-described C-4 process is still effective to affix devices and chips to these thiner and more flexible circuit boards, other types of bonding, like the thermo compression bonding process, present difficulties which have defied solution, until the present invention.

OBJECTS AND SUMMARY OF THE INVENTION

A principal object of the present invention is to provide a new and improved thiner and more flexible packaging structure and method of manufacture.

It is also an important object of the invention to provide a new and improved structure for a thin, flexible circuit for utilizing mixed bonding processes for affixing devices.

Another important object of the invention is to provide a method of manufacturing a thin, flexible electrical circuit that admits of affixing devices by mixed bonding processes.

Briefly, a method in accordance with the present invention includes the steps of applying a very thin coating of a predetermined electrically insulating material to a metal carrier, forming openings at predetermined locations through the insulating material and to the metal carrier, forming a thin electrical circuit on one side of the insulating material with portions of the circuit extending into and through the openings to the metal carrier, and etching away only predetermined portions of the metal electrical communication with the circuit at the openings.

The method of the invention provides a substrate of thin, flexible, electrically insulating material with an electrical circuit on at least one side and connected electrically through the substrate to pads on the opposite side of the substrate. Such a structure permits electrical devices, such as chips, to be affixed to the circuit using the C-4 bonding process, while other electrical devices, such as other chips, are bondable readily to the opposite side of the substrate using the thermo compression process.

Other features, objects and advantages of the invention will become more readily apparent from the following detailed description of the presently preferred embodiment, which is described in conjunction with the following single FIGURE of drawings showing in vertical cross section a part of a substrate with electrical chips on both sides of the insulating substrate.

DETAILED DESCRIPTION OF THE INVENTION

Referring to the single FIGURE of drawings, the numeral 10 identifies generally the package assembly in accordance with the invention. The package assembly 10 includes a substrate 11 on which is formed an electrical circuit 12.

The substrate 11 is formed of a suitable electrically insulating material, such as polyimide for example. The polyimide is in the form of a thin, low modulus film, and by the term "thin" is meant that it is in the order of 5 microns in thickness.

As will be described in more detail hereinafter, the electrical circuit 12 is formed on and is supported by the thin, flexible, low modulus, substrate 11. Circuit conductor leads are formed of a suitable electrically conductive material, such as chromium-copper-chromium for example, and the circuit 12 is in the same order of thickness as substrate 11.

In accordance with the custom in the industry, at least one and typically several devices such as silicon chips 13 are required to be affixed to the circuit 12 at predetermined points. The package assembly 10 of the invention provides for this by removing the chromium layer 14 to expose copper 15, thus allowing reflow soldering of a C-4 solder bump 16 to the now exposed copper pad 15.

A structure according to the invention permits other, different and additional devices to be affixed to the circuit 12 at a point that the device 13 already covers by affixing a device, such as a chip 17, to the opposite side of the substrate 11. This is done by, for example, including a small patch of insulating material 18 beneath a bump 19 to isolate the device 13 from the device 17.

On those occasions when the device 13 needs a connection electrically to the device 17, such a connection is illustrated by the bump 20 being affixed to the circuit 12 and the device 17 being affixed to the circuit 12 at the same point by the bump 21. Of course, the bump 22 connects the device 17 to the circuit 12 but not to the device 13, due to the insulation patch 18.

On the other hand, the bump 23 is between the device 17 and the circuit 12, but the substrate 11 effectively isolates the device 17 from the circuit. Of course, this bonding connection does not require that there be a device 17 or a bump 23 at this point.

Similarly, a bump 24 connects the device 17 to the circuit 12 without there being a device 13 or a C-4 bump involved at this point. The bump 24 permits the device 17 to be bonded to the circuit 12 using the thermo compression bonding process.

While single bonding connections are illustrated by these bumps 21, 22, 23 and 24, it should be understood that the number of any particular type of these connections is dictated by the requirements of a specific circuit 12. A structure in accordance with the invention permits this flexibility in selecting different bonding processes any needed number of connections and at various locations, also.

The particular chromium-copper-chromium foil that forms the electrically conductive portions of the circuit 12 has a thickness as follows:
chromium—200 Angstroms,
copper—80,000 Angstroms;
chromium—200 Angstroms.

While the above described structure permits devices to be affixed to opposite sides of a circuit, its principal advantage lies in that it permits significantly different bonding processes to be utilized in affixing these devices. This advantage will be understood better from the following description of the method of making the structure.

According to the present invention, the above described structure is fabricated by utilizing a sacrificial carrier which, after the above structure is completed, is etched away. There are two requirements for the material used for the carrier. It must be readily removeable, as by an etching process, and it must be a material that is useable in the Tape Automated Bonding technology, such as thermo compression bonding. Currently, aluminum is preferred, but copper is an exceptable alternative.

The method of making a structure as described above includes the following:
1.) Cast a liquid organic material, such as polyimide, onto a sacrificial metal carrier, such as aluminum.
2.) A-cure the polyimide.
3.) Apply a photoresist material.
4.) Expose to achieve the desired via openings, according to circuit requirements, to locate where selected bumps are to be bonded.
5.) Develop the exposed areas.
6.) Etch the polyimide with an alkaline etchant to produce openings in predetermined locations in the bonding pad areas exposing the metal carrier.
7.) Strip away the photoresist material.
8.) B-cure and C-cure the polyimide.
9.) Evaporate or sputter Cr-Cu-Cr onto the cured polyimide including the openings for the pad
10.) Apply a photoresist material to both sides of the structure.
11.) Expose the circuit side to achieve the desired circuit pattern.
12.) Etch the Cr-Cu-Cr to form a predetermined electrical circuit.
13.) Strip all photoresist and masking materials.
14.) Apply a photoresist material to both sides of the structure.
15.) Expose the bonding pad areas on the sacrificial carrier opposite the circuit side.
16.) Develop the photoresist on the bonding pad areas.
17.) Etch away the sacrificial carrier with an appropriate etchant, such as, for aluminum, use HCl or a suitable alkaline medium, or if copper, use $FeCl_3$/HCl, $CuCl_2$/HCl, or other etchant.

18.) Strip all resist materials yielding a structure, according to the invention, with circuitry on one side of the thin, flexible film and bonding pads in predetermined locations on the opposite side.

A structure fabricated utilizing the above described method, and as illustrated in the drawing, permits a device, such as a chip, to be affixed to the electrical circuit means by the process called Controlled Collapse Chip Connection (C-4) process. The bonding pad areas, identified in the drawing as 21, 22, 23 and 24, are formed uniquely for affixing a device, such as the device 17, utilizing the thermo compression process which, as mentioned above, is utilized in the Tape Automated Bonding (or "TAB") type of process.

Any amount of the sacrificial carrier can be retained as needed, as illustrated by the numeral 25 in the drawing, for such purpose as to serve as a frame for handling the structure, since a structure according to the invention is so very thin. It can also serve very usefully as a power plane, or for a ground, or other purpose, if needed.

While the structure of the invention and the method of fabricating same have been shown, described and illustrated in substantial detail in accordance with the presently preferred embodiment, it is understood that changes, alterations and modifications may occur to one skilled in this art in view of this description. Therefore, it is also understood that all such changes, alterations and modifications which come within the spirit and scope of the appended claims are within the present invention.

What is claimed is:

1. The method of manufacturing a thin flexible package assembly for utilizing different bonding techniques to affix electrical devices to be functionally operable with an electrical circuit, comprising the steps of:
    casting a film of a predetermined electrically insulating material onto a predetermined sacrificial metal carrier material;
    forming openings through said electrically insulating material at predetermined locations to identify bonding pad areas;
    forming a predetermined electrical circuit on said electrically insulating material to be supported thereby and to use at least some of said openings for electrical connections to one device, or to a plurality of devices;
    removing said sacrificial metal carrier material except in the areas of predetermined ones of said openings where metal material remaining is for use as bumps to affix at least one electrical device, by a predetermined bonding process, to be functionally operable with said electrical circuit; and
    affixing a second electrical device to said electrical circuit on the side of said insulating material opposite said one electrical device, by a bonding process different from said predetermined bonding process.

2. The method of manufacturing a thin flexible package assembly as defined in claim 7 wherein said predetermined electrically insulating material consists of polyimide.

3. The method of manufacturing a thin flexible package assembly as defined in claim 2 wherein said predetermined sacrificial metal carrier material is from the group consisting of aluminum and copper.

4. The method of manufacturing a thin flexible package assembly as defined in claim 3 wherein said predetermined electrical circuit is formed of a chromium-copper-chromium foil material.

5. The method of manufacturing a thin flexible package assembly as defined in claim 4 wherein the thickness of said electrically insulating material is in the order of 5 microns, and the thickness of said chromium is: approximately 200 Angstroms, and the thickness of said copper is: approximately 80,000 Angstroms.

6. The method of manufacturing a thin flexible package assembly as defined in claim 5 wherein said bonding process used for affixing said one electrical device is a thermo compression bonding process.

7. The method of manufacturing a thin flexible package assembly as defined in claim 6 wherein said bonding process to affix said second electrical device to said electrical circuit that is different from said predetermined bonding process consists of a Controlled Collapse Chip Connection type of bonding process.

* * * * *

UNITED STATES PATENT AND TRADEMARK OFFICE
CERTIFICATE OF CORRECTION

PATENT NO. : 5,109,601
DATED : May 5, 1992
INVENTOR(S) : Donald G. McBride

It is certified that error appears in the above—identified patent and that said Letters Patent is hereby corrected as shown below:

Column 6, line 17, change "claim 7" to read --claim 1--.

Signed and Sealed this

Twenty-ninth Day of December, 1992

Attest:

DOUGLAS B. COMER

Attesting Officer          Acting Commissioner of Patents and Trademarks